(12) United States Patent
Chen et al.

(10) Patent No.: US 12,170,400 B2
(45) Date of Patent: Dec. 17, 2024

(54) ANTENNA DEVICE AND METHOD FOR MANUFACTURING THE SAME

(71) Applicant: Advanced Semiconductor Engineering, Inc., Kaohsiung (TW)

(72) Inventors: Jenchun Chen, Kaohsiung (TW); Shyue-Long Louh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 375 days.

(21) Appl. No.: 17/383,270

(22) Filed: Jul. 22, 2021

(65) Prior Publication Data
US 2023/0023398 A1 Jan. 26, 2023

(51) Int. Cl.
*H01Q 1/44* (2006.01)
*H01Q 1/52* (2006.01)

(52) U.S. Cl.
CPC .............. *H01Q 1/44* (2013.01); *H01Q 1/52* (2013.01)

(58) Field of Classification Search
CPC .................................. H01Q 1/44; H01Q 1/52
See application file for complete search history.

(56) References Cited

U.S. PATENT DOCUMENTS

| | | | |
|---|---|---|---|
| 9,848,496 B2 | 12/2017 | Nakao | |
| 2019/0097304 A1* | 3/2019 | Hsiao | H01L 23/49838 |
| 2019/0304901 A1* | 10/2019 | Hwang | H01Q 21/065 |
| 2022/0131262 A1* | 4/2022 | Chiang | H01Q 21/065 |
| 2022/0148983 A1* | 5/2022 | Lee | H01L 25/16 |

FOREIGN PATENT DOCUMENTS

JP 2004015160 A * 1/2004

* cited by examiner

*Primary Examiner* — Dieu Hien T Duong
(74) *Attorney, Agent, or Firm* — FOLEY & LARDNER LLP

(57) ABSTRACT

An antenna device and a method for manufacturing the same are provided. The antenna device includes a carrier, an antenna portion, a first portion and a second portion. The antenna portion is located on the carrier. The first portion is located on the carrier. The second portion is located on the carrier and is configured for blocking a material from entering the antenna area, wherein the material covers a lateral surface of the carrier.

15 Claims, 20 Drawing Sheets

ANTENNA DEVICE AND METHOD FOR MANUFACTURING THE SAME

BACKGROUND

1. Field of the Disclosure

The present disclosure relates to an antenna device and a method for manufacturing the same, and more particularly to an antenna device including an encapsulant and a method for manufacturing the same.

2. Description of the Related Art

In an antenna device, a high dielectric constant (Dk) dielectric material is provided to cover an antenna to enhance the performance of the antenna. However, such high Dk dielectric material has a relative high modulus and hardness. During the singulation process, cracking and/or chipping may occur on the edge of the high Dk dielectric material, which would adversely affect the appearance of the antenna device and the subsequent manufacturing stage. For example, the antenna device may fail to pass the external appearance test. In a worse case, over-plating of a shielding layer may cover the antenna of the antenna device, which may adversely affect the performance of the antenna device.

SUMMARY

In some embodiments, an antenna device includes a carrier, an antenna portion, a first portion and a second portion. The antenna portion is located on the carrier. The first portion is located on the carrier. The second portion is located on the carrier and is configured for blocking a material from entering the antenna area, wherein the material covers a lateral surface of the carrier.

In some embodiments, an antenna device includes a carrier, an antenna and a first encapsulant. The antenna is disposed on the carrier. The first encapsulant is disposed on the carrier. The first encapsulant includes a main portion covering the antenna and an extending portion uncovering the antenna. A thickness of the extending portion is less than a thickness of the main portion. A lateral surface of the extending portion is non-coplanar with a lateral surface of the carrier.

In some embodiments, a method for manufacturing an antenna device includes: (a) providing a structure including a carrier, a second encapsulant disposed adjacent to a first surface of the carrier, and an antenna disposed adjacent to a second surface of the carrier; and (b) forming a first encapsulant on the second surface of the carrier, wherein the first encapsulant includes a main portion covering the antenna and an extending portion uncovering the antenna, wherein a thickness of the extending portion is less than a thickness of the main portion, and a lateral surface of the extending portion is non-coplanar with a lateral surface of the carrier.

BRIEF DESCRIPTION OF THE DRAWINGS

Aspects of some embodiments of the present disclosure are readily understood from the following detailed description when read with the accompanying figures. It is noted that various structures may not necessarily be drawn to scale, and dimensions of the various structures may be arbitrarily increased or reduced for clarity of discussion.

DETAILED DESCRIPTION

Figure 1:
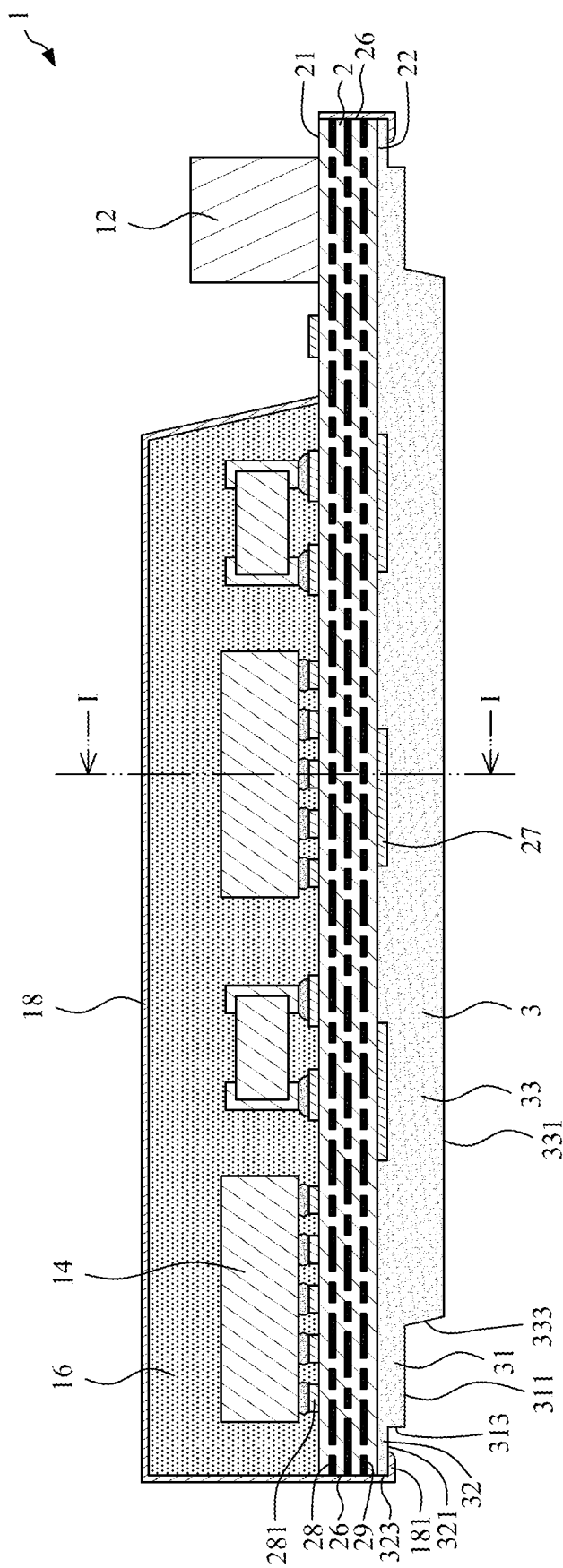
FIG. 1 illustrates a cross-sectional view of an antenna device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
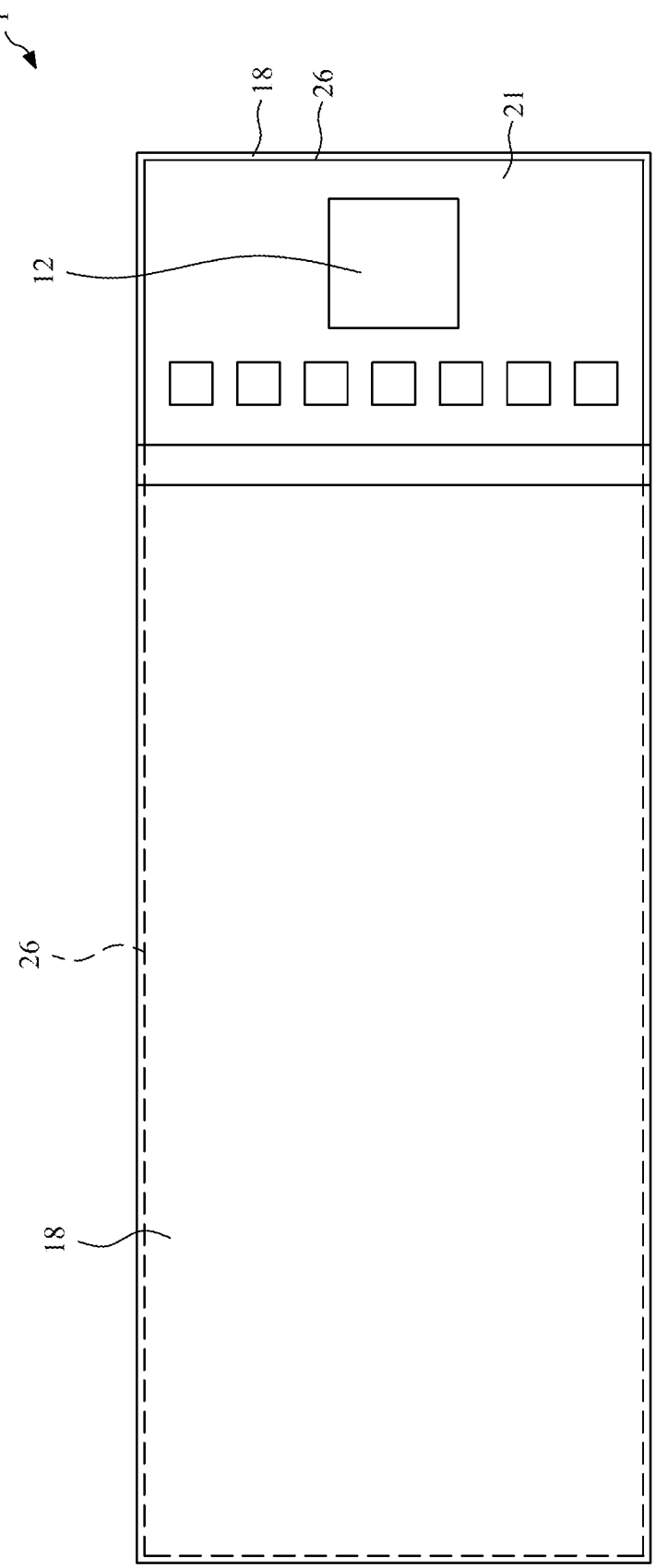
FIG. 2A illustrates a top view of the antenna device of FIG. 1.
Figure 2B:
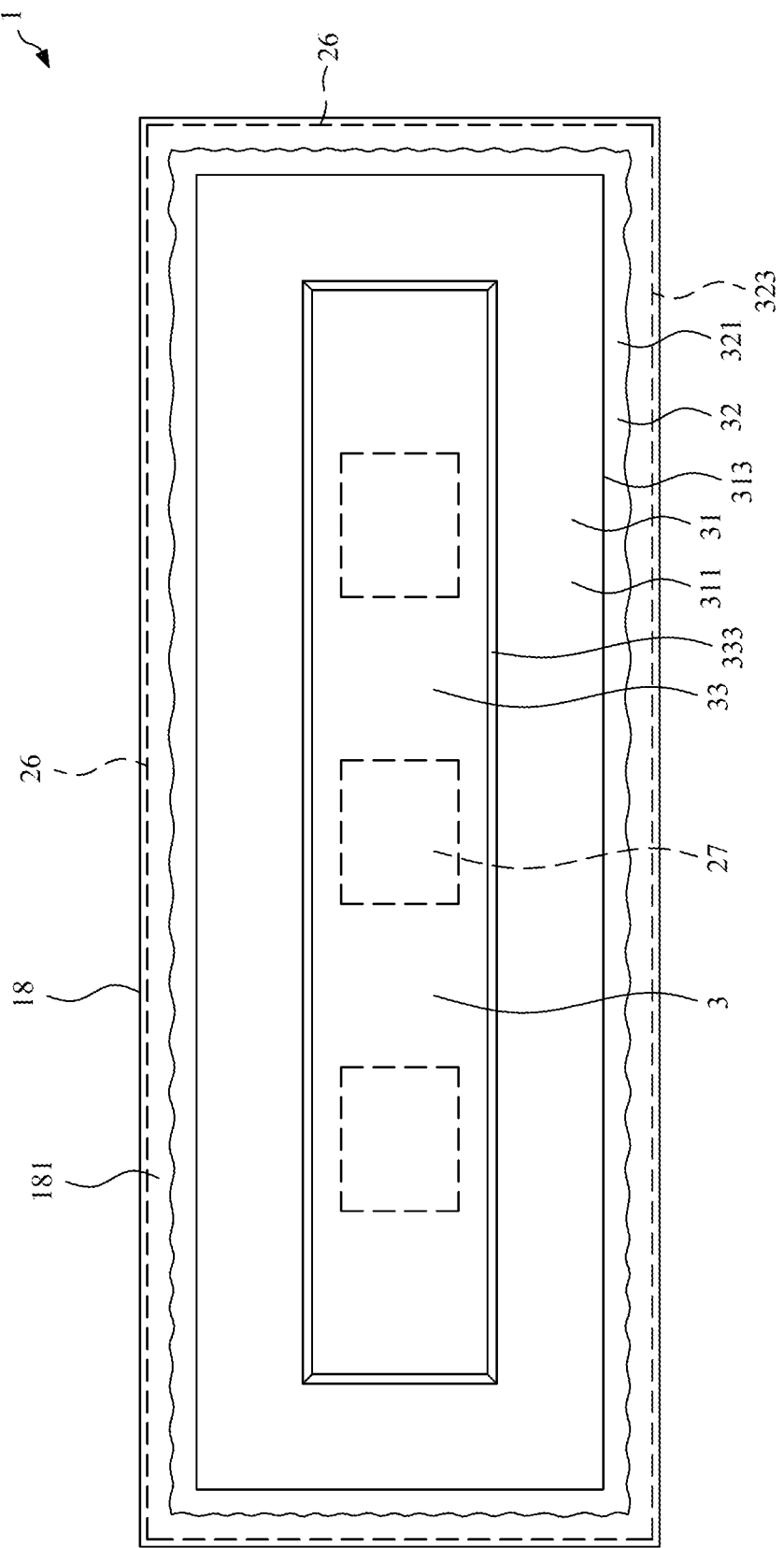
FIG. 2B illustrates a bottom view of the antenna device of FIG. 1.
Figure 2C:
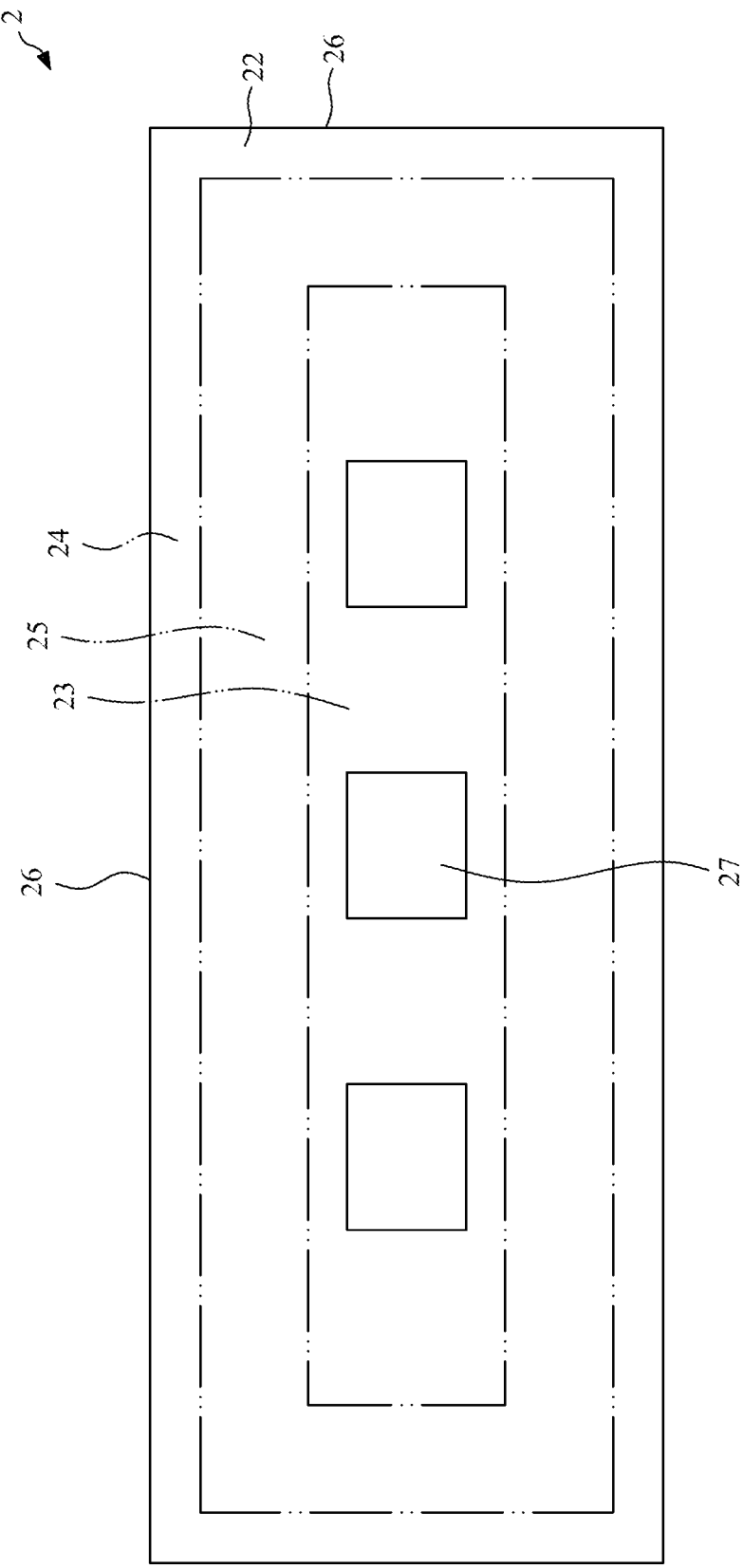
FIG. 2C illustrates a bottom view of a carrier of the antenna device of FIG. 1.
Figure 3:
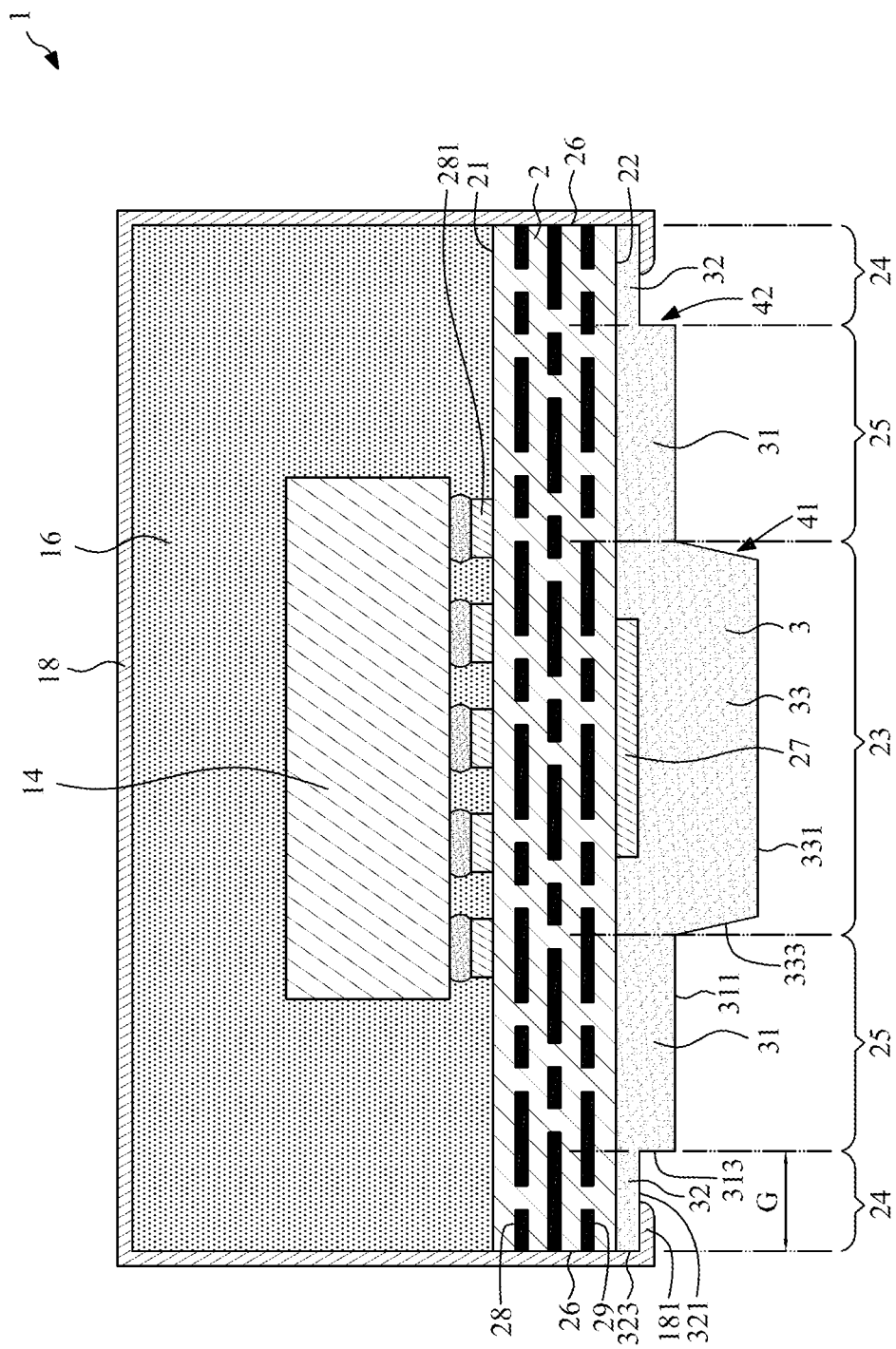
FIG. 3 illustrates a cross-sectional view taken along line I-I in FIG. 1.

FIG. 1 illustrates a cross-sectional view of an antenna device 1 according to some embodiments of the present disclosure. FIG. 2A illustrates a top view of the antenna device 1 of FIG. 1. FIG. 2B illustrates a bottom view of the antenna device 1 of FIG. 1. FIG. 2C illustrates a bottom view of a carrier 2 of the antenna device 1 of FIG. 1. FIG. 3 illustrates a cross-sectional view taken along line I-I in FIG. 1. The antenna device 1 may include a carrier 2, an antenna portion 23, a first portion 24, a second portion 25, a first encapsulant 3, a connector 12, at least one electronic component 14, a second encapsulant 16 and a shielding layer 18.

The carrier 2 may be a substrate. The carrier 2 may have a first surface 21, a second surface 22 opposite to the first surface 21, and a lateral surface 26 extending between the first surface 21 and the second surface 22. The carrier 2 may include a plurality of dielectric layers, a plurality of circuit layers interposed between the dielectric layers, a plurality of bonding pads 281 and a plurality of antennas 27. A material of the dielectric layers of the carrier 2 may include an insulating material, a passivation material, a dielectric material or a solder resist material, such as, for example, a benzocyclobutene (BCB) based polymer, a polyimide (PI) or a polypropylene (PP). In some embodiments, the circuit layers of the carrier 2 may include at least one radio frequency (RF) routing layer 28 and at least one antenna routing layer 29. The RF routing layer 28 may be near to the first surface 21, and the antenna routing layer 29 may be near to the second surface 22. The bonding pads 281 may be disposed adjacent to or disposed on the first surface 21 of the carrier 2, and may be electrically connected to the RF routing layer 28. The antennas 27 may be a plurality of antenna patterns or antenna elements that are disposed adjacent to or disposed on the second surface 22 of the carrier 2. Alternatively, the antennas 27 may be disposed within the carrier 2. In some embodiments, the antennas 27 may be electrically connected to or electrically coupled to the antenna routing layer 29. Alternatively, the antennas 27 may be a portion of the antenna routing layer 29. The antenna 27 may be configured to radiate wireless signals such as radio frequency (RF) signals. Thus, the antenna 27 may be also referred to as a radiation portion.

Referring to FIGS. 2C and 3, the carrier 2 may include the antenna portion 23, the first portion 24 and the second portion 25. The second portion 25 is around or surrounds the antenna portion 23, and the first portion 24 is around or surrounds the second portion 25. Thus, the second portion 25 may be disposed between the antenna portion 23 and the first portion 24. The antennas 27 may be disposed in the antenna portion 23, and may be disposed outside the first portion 24 and the second portion 25. In some embodiments, the antenna portion 23, the first portion 24 and the second portion 25 may be portions of the carrier 2, or may be portions of the second surface 22 of the carrier 2, or may be portions of an object (e.g., the first encapsulant 3) that is disposed on the second surface 22 of the carrier 2.

In some embodiments, the antenna portion 23 may be also referred to as "an antenna region" or "an antenna area". The antenna portion 23 may be located on the carrier 2 and may protrude from the carrier 2. The antenna portion 23 may be configured to enhance radiation performance of the antennas 27. Further, the first portion 24 may be also referred to as "a material bleedable region" or "a material bleedable area". The first portion 24 may be located on the carrier 2 and may protrude from the carrier 2. The first portion 24 may be disposed adjacent to the lateral surface 26 of the carrier 2. Further, the second portion 25 may be also referred to as "a barrier region" or "a barrier area". The second portion 25 may be located on the carrier 2 and may protrude from the carrier 2. The second portion 25 may be configured for blocking or preventing a material (e.g., the shielding layer 18) from entering or contacting the antenna area 23. The material (e.g., the shielding layer 18) may be from the first portion 24.

In the illustrated embodiment, the antenna portion 23, the first portion 24 and the second portion 25 be portions, areas or regions of the second surface 22 of the carrier 2. The second portion 25 may surround the antenna portion 23, and the first portion 24 may surround the second portion 25. The antennas 27 may be disposed in the antenna portion 23. The first encapsulant 3 may be disposed on the second surface 22 of the carrier 2. The first encapsulant 3 may include a high dielectric constant (Dk)/high dissipation factor (Df) material, and may be a radiation enhanced element. The first encapsulant 3 may be configured to increase gain width, reduce insertion loss and reduce return loss. As shown in FIG. 3, the first encapsulant 3 may include a main portion 33, an extending portion 31 and a peripheral portion 32. For example, the main portion 33, the extending portion 31 and the peripheral portion 32 may be formed concurrently and integrally as a monolithic structure. The extending portion 31 may extend from the main portion 33, and the peripheral portion 32 may extend from the extending portion 31.

The main portion 33 may be disposed on the antenna portion 23 of the second surface 22 of the carrier 2, and may cover the antenna(s) 27. The main portion 33 may have a first surface 331 and a lateral surface 333. The extending portion 31 may be disposed on the second portion 25 of the second surface 22 of the carrier 2, and may have a first surface 311 and a lateral surface 313. The peripheral portion 32 may be disposed on the first portion 24 of the second surface 22 of the carrier 2, and may have a first surface 321 and a lateral surface 323. The extending portion 31 may surround the main portion 33, and the peripheral portion 32 may surround the extending portion 31. The peripheral portion 32 is closer to the lateral surface 26 of the carrier 2 than the extending portion 31 is. The extending portion 31 and the peripheral portion 32 do not cover the antenna(s) 27. Alternatively, the extending portion 31 and the peripheral portion 32 uncover the antenna(s) 27.

In addition, the lateral surface 323 of the peripheral portion 32 may be substantially coplanar with the lateral surface 26 of the carrier 2, and the lateral surface 313 of the extending portion 31 may be non-coplanar with the lateral surface 26 of the carrier 2. Thus, the lateral surface 313 of the extending portion 31 may be not coplanar with the lateral surface 26 of the carrier 2, and a gap G may be formed between the lateral surface 313 of the extending portion 31 and the lateral surface 26 of the carrier 2. The gap G may be substantially equal to a width of the peripheral portion 32.

A thickness of the extending portion 31 is less than a thickness of the main portion 33, so as to form a first step 41. The first step 41 may be defined by the first surface 331 of the main portion 33, the lateral surface 333 of the main portion 33 and the first surface 311 of the extending portion 31. Further, a thickness of the peripheral portion 32 is less than a thickness of the extending portion 31 so as to form a second step 42. The second step 42 may be defined by the first surface 311 of the extending portion 31, the lateral surface 313 of the extending portion 31 and the first surface 321 of the peripheral portion 32.

In some embodiments, the antenna portion 23, the first portion 24 and the second portion 25 may be referred to the object on the second surface 22 of the carrier 2. That is, the antenna portion 23 may be referred to the main portion 33 of the first encapsulant 3, the first portion 24 may be referred to the peripheral portion 32 of the first encapsulant 3, and the second portion 25 may be referred to the extending portion 31 of the first encapsulant 3. Thus, the first step 41 may be defined by the antenna portion 23 and the second portion 25, and the second step 42 may be defined by the first portion 24 and the second portion 25.

The electronic component 14 (e.g., a semiconductor die or a passive component) may be disposed on and electrically connected to the bonding pads 281 on the first surface 21 of the carrier 2. Thus, the location of the electronic component 14 may be opposite to the location of the antenna portion 23. The electronic component 14 may be disposed on the carrier 2 at a side opposite to the antenna portion 23 and configured for electrically connecting to the antenna 27 covered by the antenna portion 23. The second encapsulant 16 (e.g., a molding compound with or without fillers) may cover at least a portion of the first surface 21 of the carrier 2 and encapsulate the electronic component 14. Thus, the location of the second encapsulant 16 may be opposite to the location of the first encapsulant 3. The second encapsulant 16 may be distance from, spaced apart from, or apart from the first encapsulant 3. A material of the second encapsulant 16 may be different from a material of the first encapsulant 3. In some embodiments, a modulus and a hardness of the first encapsulant 3 may be greater than a modulus and a hardness of the second encapsulant 16, respectively. A thickness of the second encapsulant 16 may be greater than a thickness of the first encapsulant 3. In addition, the shielding layer 18 may cover the second encapsulant 16, the lateral surface 26 of the carrier 2 and the lateral surface 323 of the peripheral portion 32 of the first encapsulant 3. The shielding layer 18 may be a plated metal layer that is used for EMI (electromagnetic interference) shielding. Thus, the shielding layer 18 may include an electromagnetic interference (EMI) shielding material.

The connector 12 may be disposed on a portion of the first surface 21 of the carrier 2 exposed from the second encapsulant 16. That is, the connector 12 may be disposed on and electrically connected to the portion of the first surface 21 of the carrier 2 that is not covered by the second encapsulant 16. Thus, the connector 12 and the second encapsulant 16 may be disposed on the first surface 21 of the carrier 2 side by side, and there may be a gap between the connector 12 and the second encapsulant 16.

Figure 7:
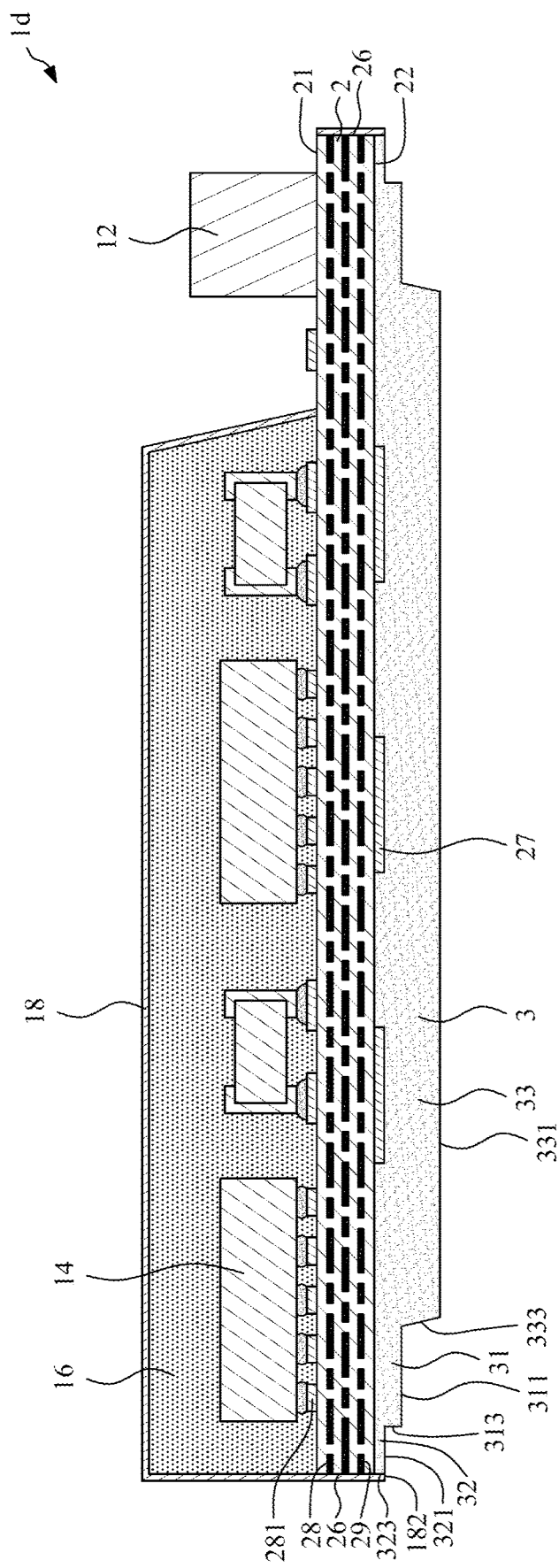
FIG. 7 illustrates a cross-sectional view of an antenna device according to some embodiments of the present disclosure.

In the embodiment illustrated in FIG. 1 to FIG. 3, during a cutting stage or a singulation stage, cracking and/or chipping may occur on an edge of the first encapsulant 3 since the first encapsulant 3 has a relative high modulus and hardness. Thus, during a plating process of the shielding layer 18, an extending portion 181 of the shielding layer 18 may extend to cover a portion of a bottom surface of the first encapsulant 3, which may be designated as bleeding or over-plating. If the extending portion 181 of the shielding layer 18 extend to cover the antenna(s) 27 or the main portion 33 of the first encapsulant 3, the performance of the antenna device 1 may be adversely affected. To address such concerns, the first encapsulant 3 has a gradually reduced thickness from a center portion to an edge portion. For example, the thickness of the extending portion 31 is less than a thickness of the main portion 33, and the thickness of the peripheral portion 32 is less than a thickness of the extending portion 31 so as to form the first step 41 and the second step 42. Since the peripheral portion 32 has a small thickness, the degree of cracking and/or chipping of the first encapsulant 3 is reduced. Therefore, there may be no or even a small amount of the extending portion 181 of the shielding layer 18 that may extend to the first surface 321 of the peripheral portion 32. In a best case, there may be no shielding layer 18 extending to the first surface 321 of the peripheral portion 32 (as shown in FIG. 7), the antenna device 1 may pass the external appearance test and the performance of the antenna device 1 is improved. In another case, as shown in FIG. 3, the small amount of the extending portion 181 of the shielding layer 18 may be disposed on the first surface 321 of the peripheral portion 32, and may be stopped by the lateral surface 313 of the extending portion 31. Thus, the risk that the extending portion 181 of the shielding layer 18 climbs over the second step 42 is reduced. As a result, the performance of the antenna device 1 is improved.

In addition, during the singulation stage, a cutting tool is used cut a strip to singulate the carrier 2, the first encapsulant 3 and the second encapsulant 16. Since the peripheral portion 32 has a smallest thickness, the amount of the first encapsulant 3 to be cut by the cutting tool is reduced. As a result, the life of the cutting tool is improved.

Figure 4:
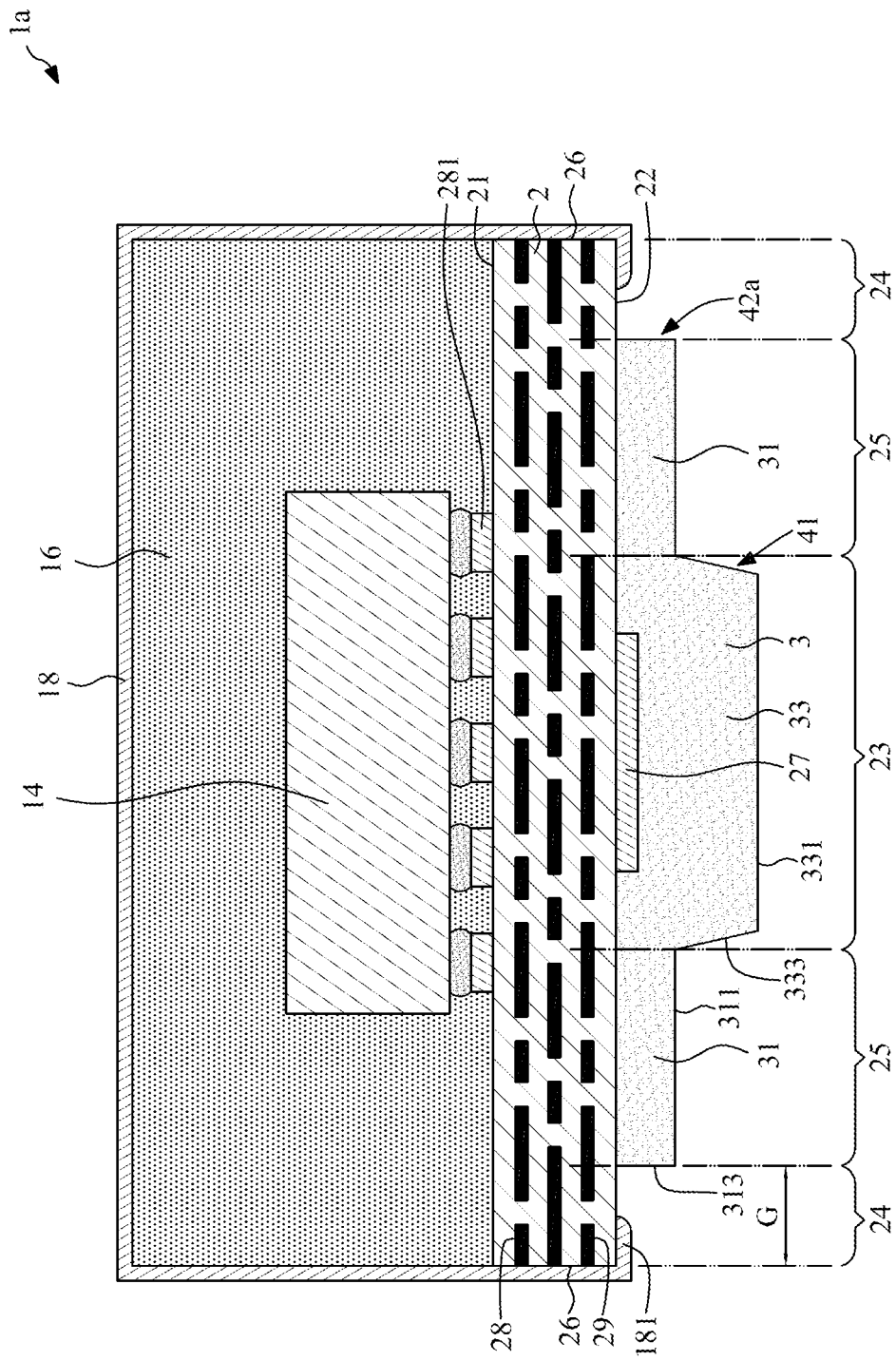
FIG. 4 illustrates a cross-sectional view of an antenna device according to some embodiments of the present disclosure.

FIG. 4 illustrates a cross-sectional view of an antenna device 1a according to some embodiments of the present disclosure. The antenna device 1a shown in FIG. 4 may be similar to the antenna device 1 shown in FIG. 3, except that the peripheral portion 32 of the first encapsulant 3 of FIG. 3 is omitted. Thus, the first portion 24 of the second surface 22 extending from the lateral surface 26 of the carrier 2 may be exposed from the first encapsulant 3. A second step 42a may be defined by the first surface 311 of the extending portion 31, the lateral surface 313 of the extending portion 31 and the first portion 24 of the second surface 22 of the carrier 2. The extending portion 181 of the shielding layer 18 may be disposed on and contact the first portion 24 of the second surface 22 of the carrier 2.

Figure 5:
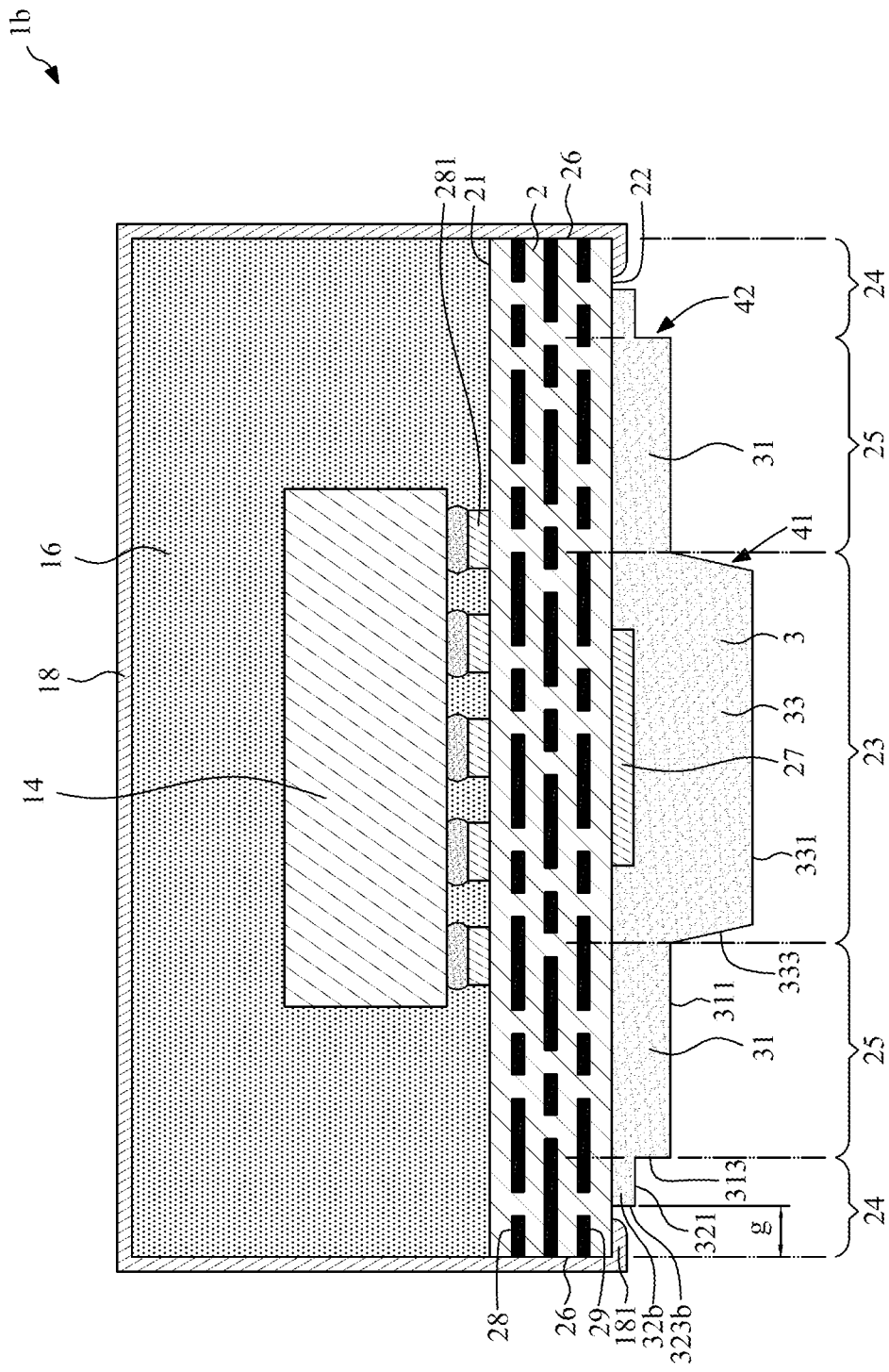
FIG. 5 illustrates a cross-sectional view of an antenna device according to some embodiments of the present disclosure.
Figure 5A:
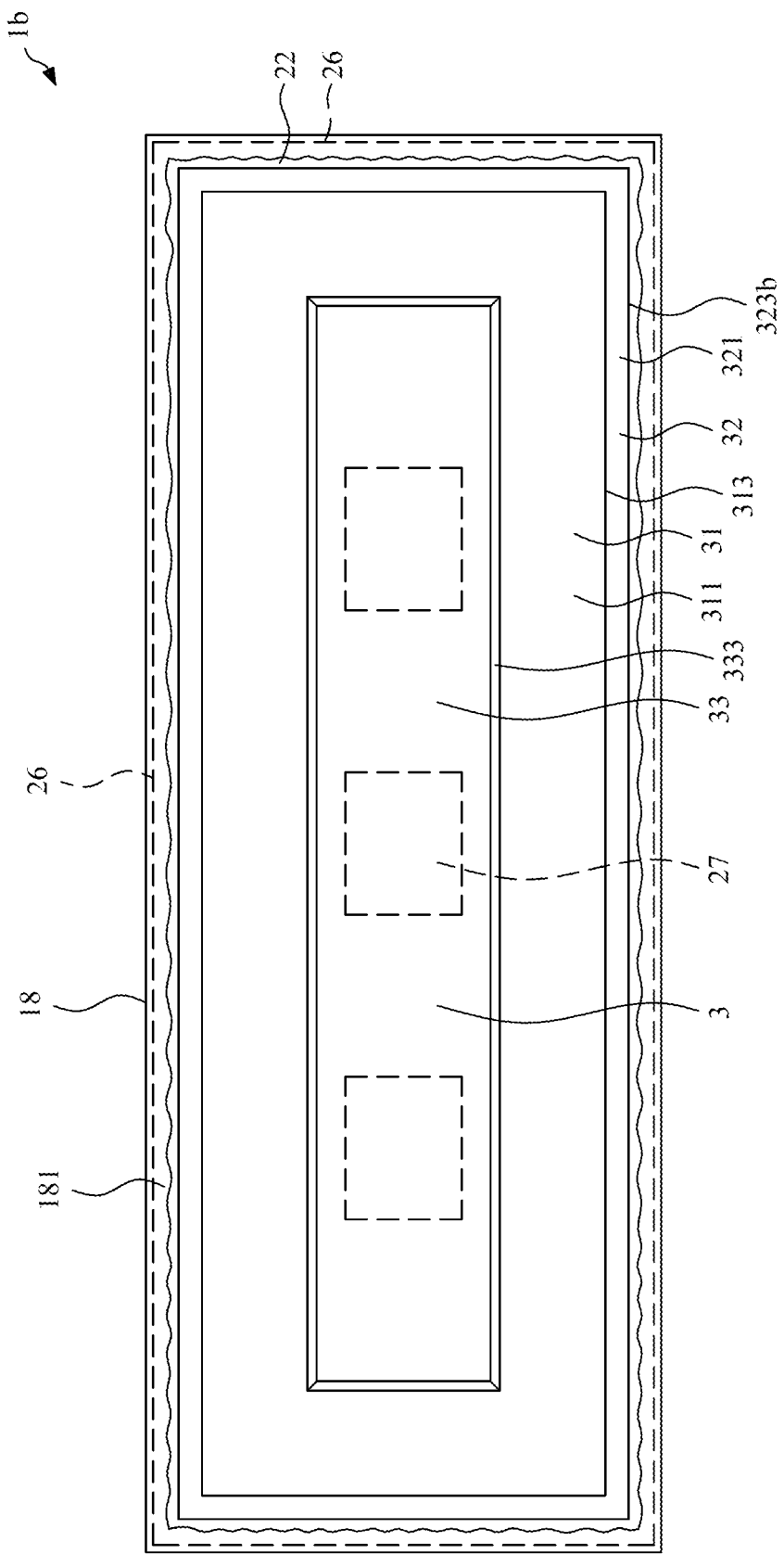
FIG. 5A illustrates a bottom view of the antenna device of FIG. 5.

FIG. 5 illustrates a cross-sectional view of an antenna device 1b according to some embodiments of the present disclosure. FIG. 5A illustrates a bottom view of the antenna device 1b of FIG. 5. The antenna device 1b shown in FIG. 5 may be similar to the antenna device 1 shown in FIG. 3, except that a portion of the peripheral portion 32 of the first encapsulant 3 of FIG. 3 is removed so as to form the peripheral portion 32b of the first encapsulant 3 of FIG. 5. A width of the peripheral portion 32b of the first encapsulant 3 of FIG. 5 is less than a width of the peripheral portion 32 of the first encapsulant 3 of FIG. 3. As shown in FIG. 5, the peripheral portion 32b of the first encapsulant 3 has a lateral surface 323b that is non-coplanar with the lateral surface 26 of the carrier 2. A gap g may be formed between the lateral surface 323b of the peripheral portion 32b of the first encapsulant 3 and the lateral surface 26 of the carrier 2. Thus, a portion of the first portion 24 of the second surface 22 of the carrier 2 may be exposed from the first encapsulant 3. The extending portion 181 of the shielding layer 18 may be disposed on and contact the first portion 24 of the second surface 22 of the carrier 2.

Figure 6:
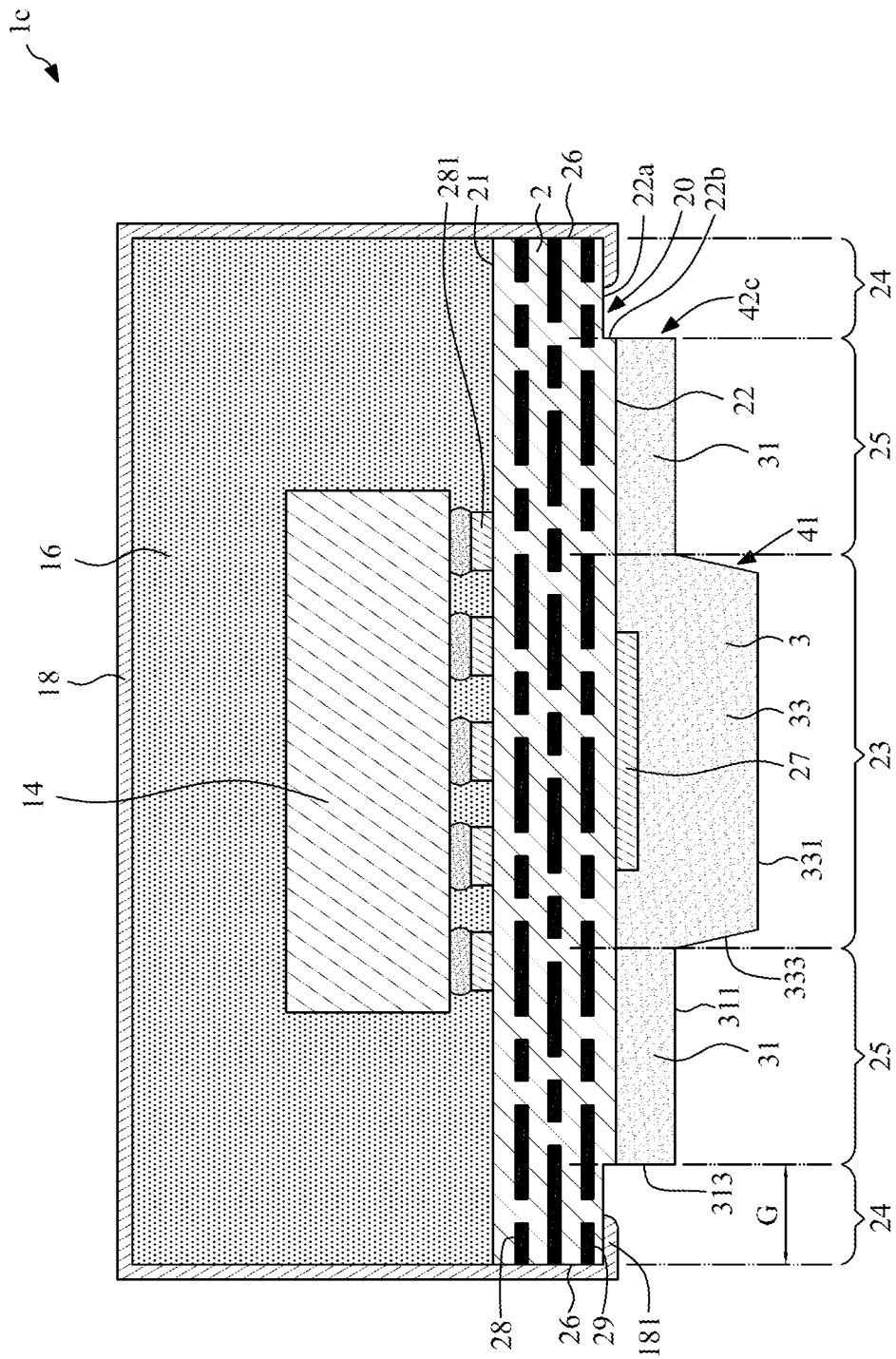
FIG. 6 illustrates a cross-sectional view of an antenna device according to some embodiments of the present disclosure.

FIG. 6 illustrates a cross-sectional view of an antenna device 1c according to some embodiments of the present disclosure. The antenna device 1c shown in FIG. 6 may be similar to the antenna device 1 shown in FIG. 3, except that the peripheral portion 32 of the first encapsulant 3 and a portion of the first portion 24 of the carrier 2 are removed. Thus, a peripheral notch 20 is formed on the carrier 2 and recessed from the second surface 22 of the carrier 2. The peripheral notch 20 may be defined by a first surface 22a and a second surface 22b. The first surface 22a may be parallel with the second surface 22 of the carrier 2. The second surface 22b may be substantially coplanar with the lateral surface 313 of the extending portion 31 of the first encapsulant 3. The first surface 22a and the second surface 22b may be exposed from the first encapsulant 3. A second step 42c may be defined by the first surface 311 of the extending portion 31, the lateral surface 313 of the extending portion 31 and the peripheral notch 20 of the carrier 2. The extending portion 181 of the shielding layer 18 may be disposed on and contact the first surface 22a.

Figure 7A:
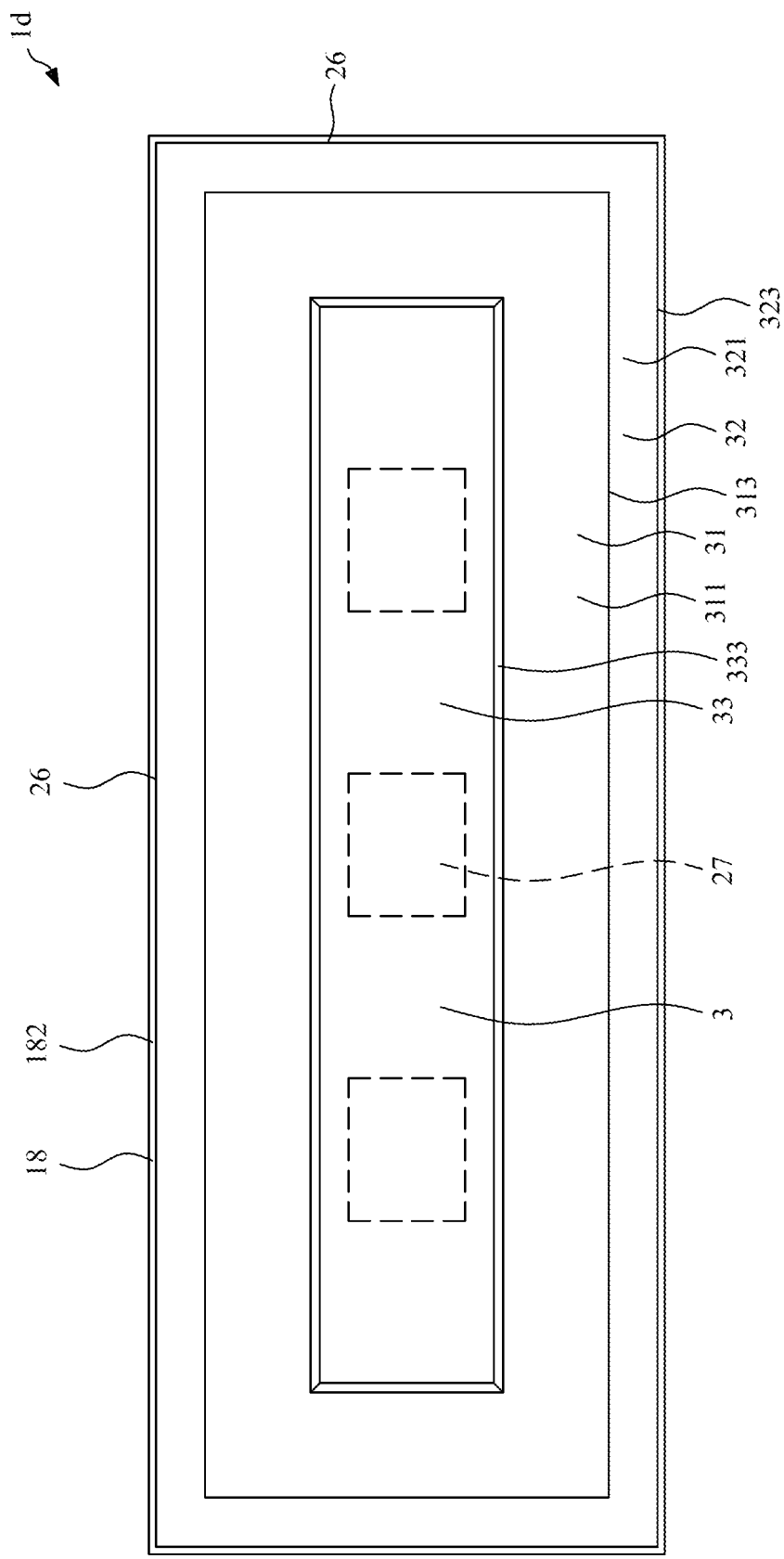
FIG. 7A illustrates a bottom view of the antenna device of FIG. 7.

FIG. 7 illustrates a cross-sectional view of an antenna device 1d according to some embodiments of the present disclosure. FIG. 7A illustrates a bottom view of the antenna device 1d of FIG. 7. The antenna device 1d shown in FIG. 7 and FIG. 7d may be similar to the antenna device 1 shown in FIG. 1 to FIG. 3, except that the extending portion 181 of the shielding layer 18 is omitted. That is, the shielding layer 18 does not extend to the bottom side of the carrier 2 (e.g., the first surface 321 of the peripheral portion 32 of the first encapsulant 3). A bottom surface of the shielding layer 18 may be substantially coplanar with the first surface 321 of the peripheral portion 32 of the first encapsulant 3.

FIG. 8 through FIG. 13 illustrate a method for manufacturing an antenna device according to some embodiments of the present disclosure. In some embodiments, the method is for manufacturing the antenna device 1 shown in FIG. 1 to FIG. 4.

Figure 8:
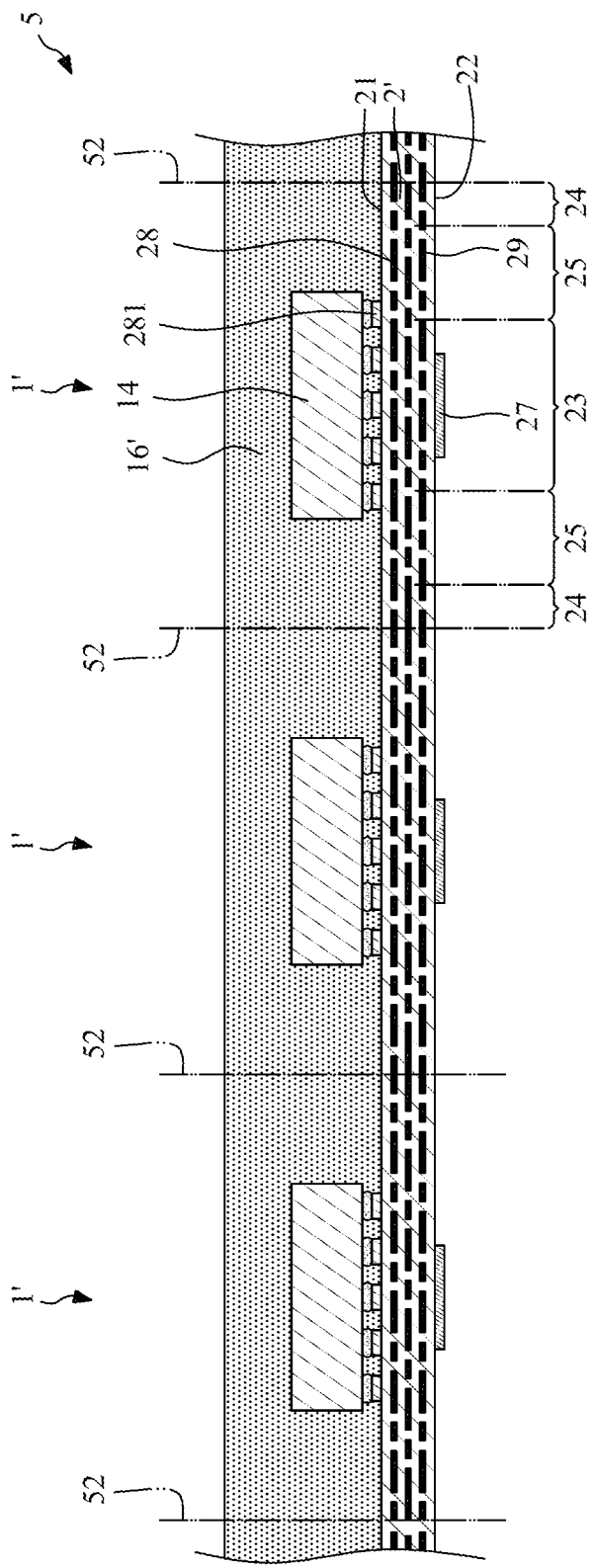
FIG. 8 illustrates one or more stages of an example of a method for manufacturing an antenna device according to some embodiments of the present disclosure.

Referring to FIG. 8, a structure 5 is provided. The structure 5 may be in a strip type, and may include a carrier 2', a second encapsulant 16' and at least one electronic component 14. The carrier 2', the second encapsulant 16' and the electronic component 14 of FIG. 8 may be similar to the carrier 2, the second encapsulant 16 and the electronic component 14 of FIG. 1 to FIG. 4, respectively.

The carrier 2' may have a first surface 21 and a second surface 22. The carrier 2' may include a plurality of dielectric layers, a plurality of circuit layers interposed between the dielectric layers, a plurality of bonding pads 281 and a plurality of antennas 27. In some embodiments, the circuit layers of the carrier 2' may include at least one radio frequency (RF) routing layer 28 and at least one antenna routing layer 29. The bonding pads 281 may be disposed adjacent to or disposed on the first surface 21 of the carrier 2'. The antennas 27 may be a plurality of antenna patterns or antenna elements that are disposed adjacent to or disposed on the second surface 22 of the carrier 2'. The carrier 2' may include a plurality of antenna portions 23, a plurality of first portions 24 and a plurality of second portions 25. Each of the second portions 25 is around or surrounds each of the antenna portions 23, and each of the first portions 24 is around or surrounds each of the second portions 25. The antennas 27 may be disposed in the antenna portions 23, and may be disposed outside the first portions 24 and the second portions 25.

The electronic component 14 (e.g., a semiconductor die or a passive component) may be disposed on and electrically connected to the bonding pads 281. The second encapsulant 16' (e.g., a molding compound with or without fillers) may be disposed adjacent to or disposed on the first surface 21 of the carrier 2' to cover at least a portion of the first surface 21 of the carrier 2' and encapsulate the electronic component 14.

As shown in FIG. 8, the structure 5 may have a plurality of imaginary cutting lines 52 to define a plurality of units 1'. Each of the units 1' may be similar to the antenna device 1 shown in FIG. 1 to FIG. 4.

Figure 9:
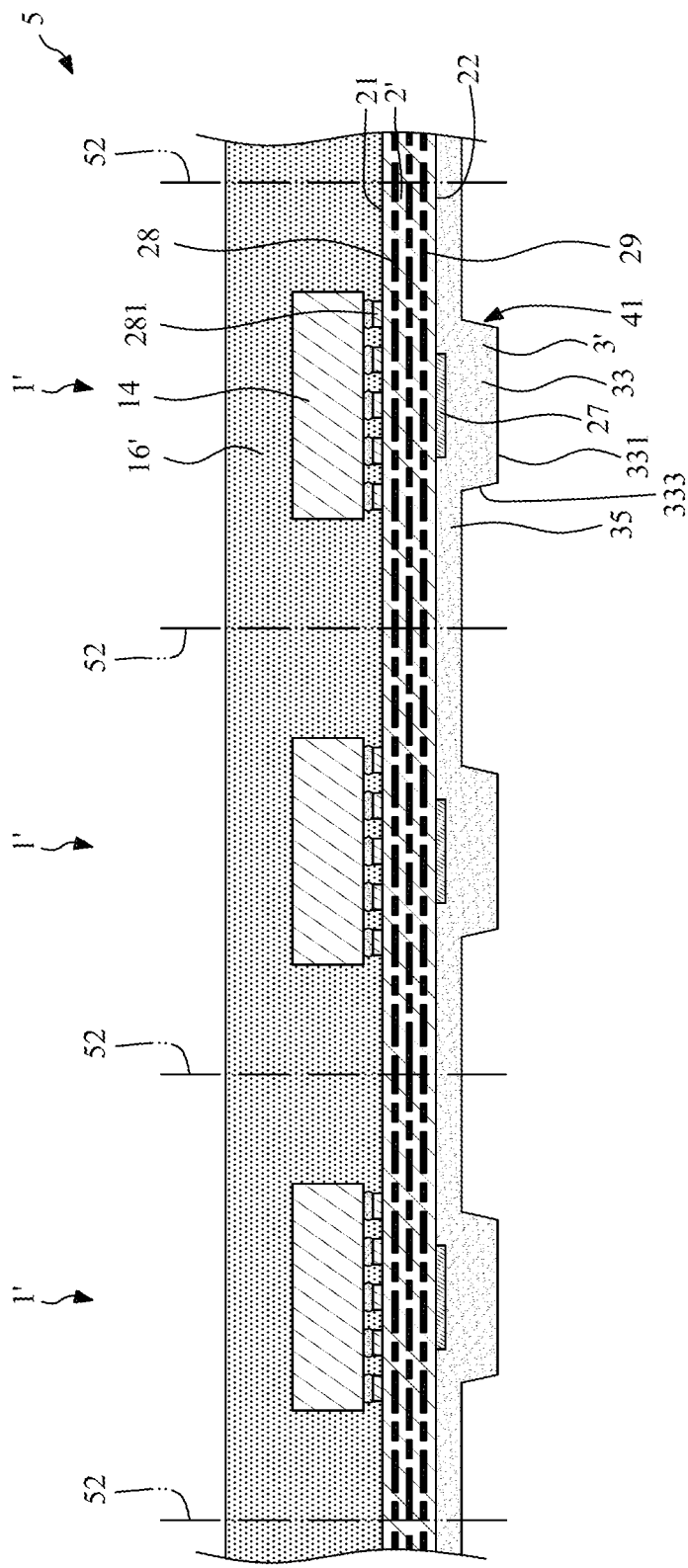
FIG. 9 illustrates one or more stages of an example of a method for manufacturing an antenna device according to some embodiments of the present disclosure.

Referring to FIG. 9, a first encapsulant 3' may be formed or disposed on the second surface 22 of the carrier 2. The first encapsulant 3' may include a plurality of main portions 33 and a base portion 35. Each of the main portions 33 may be disposed on each of the antenna portions 23 of the second surface 22 of the carrier 2', and may cover the antenna(s) 27. The base portion 35 may be disposed on the first portions 24 and the second portions 25 of the second surface 22 of the carrier 2'. The main portions 33 may protrude from the base portion 35 to form a plurality of first steps 41. Thus, a thickness of the base portion 35 is less than a thickness of the main portion 33

As shown in FIG. 9, each of the units 1' may be similar to the antenna device 1 shown in FIG. 1 to FIG. 4.

Figure 10:
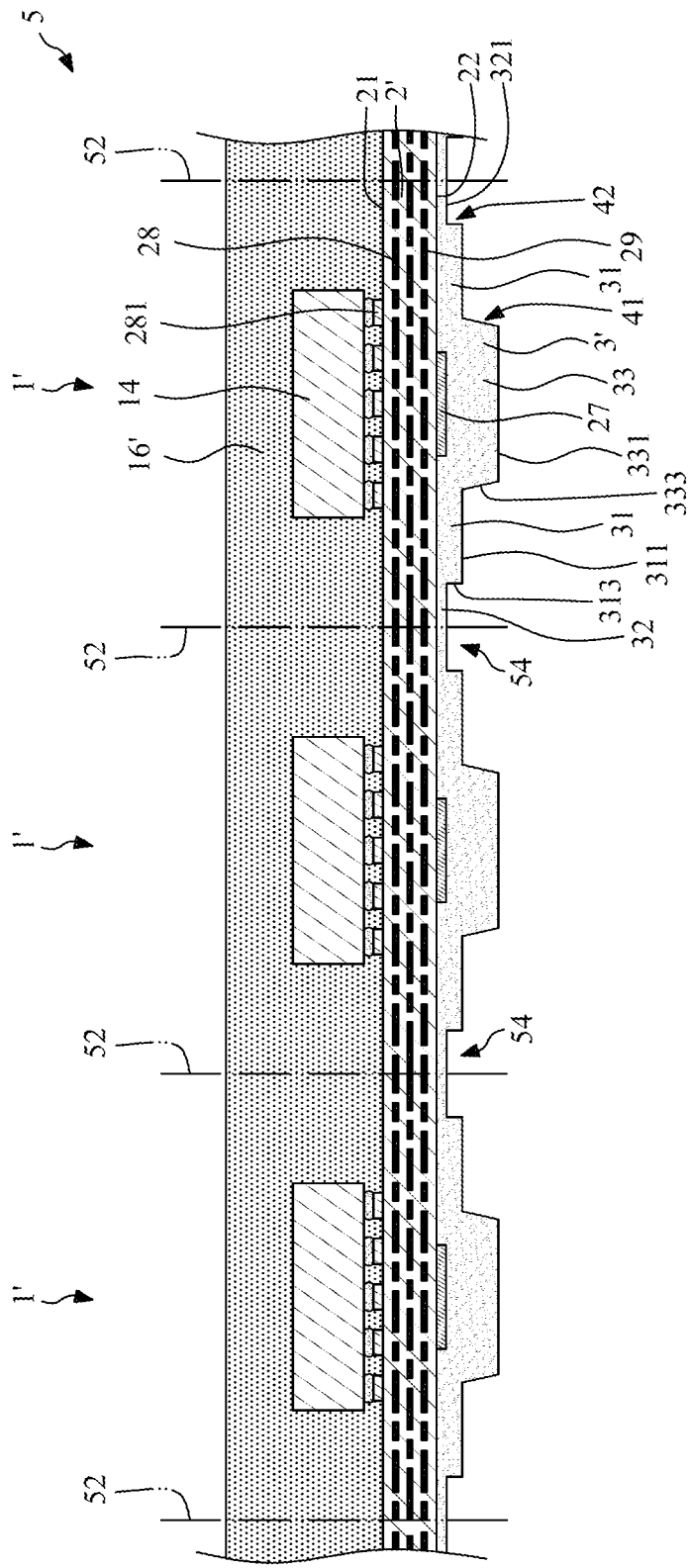
FIG. 10 illustrates one or more stages of an example of a method for manufacturing an antenna device according to some embodiments of the present disclosure.

Referring to FIG. 10, portions of the base portion 35 on the cutting lines 52 are removed by, for example, a cutting tool such as a blade, so as to form a plurality of recesses 54 or grooves over the carrier 2'. The portions of the base portion 35 that are not removed (e.g., cut by the cutting tool) become a plurality of extending portions 31, and the portions of the base portion 35 that are thinned by the cutting tool become a plurality of peripheral portions 32. The extending portions 31 may be disposed on the second portions 25 of the second surface 22 of the carrier 2', and may have a first surface 311 and a lateral surface 313. The peripheral portions 32 may be disposed on the first portions 24 of the second surface 22 of the carrier 2', and may have a first surface 321. Each of the extending portions 31 may surround each of the main portions 33, and each of the peripheral portions 32 may surround each of the extending portions 31. The extending portions 31 and the peripheral portions 32 do not cover the antenna(s) 27. Alternatively, the extending portions 31 and the peripheral portions 32 uncover the antenna(s) 27. The thickness of the peripheral portion 32 is less than the thickness of the extending portion 31. A second step 42 is defined by the extending portion 31 and the peripheral portion 32 of the first encapsulant 3'.

Figure 11:
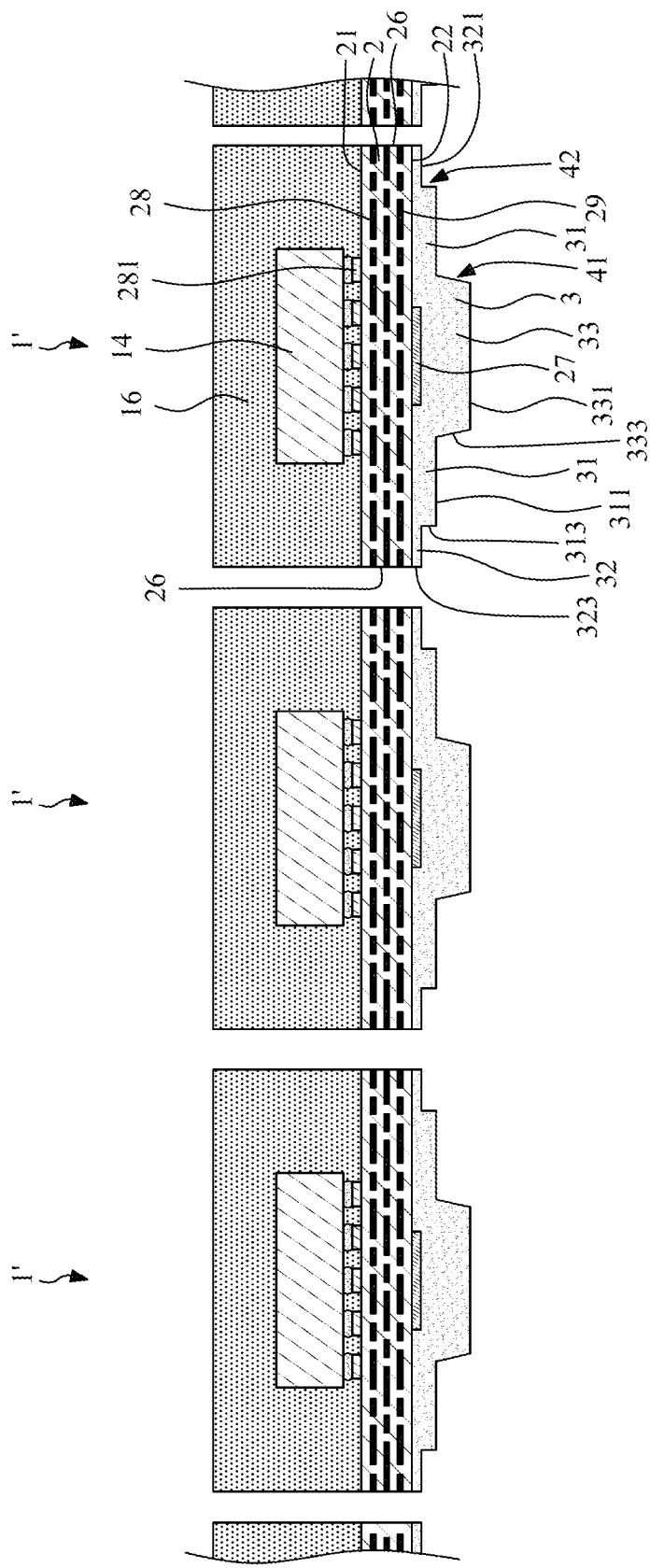
FIG. 11 illustrates one or more stages of an example of a method for manufacturing an antenna device according to some embodiments of the present disclosure.

Referring to FIG. 11, the carrier 2', the second encapsulant 16' and the peripheral portions 32 of the first encapsulant 3' are singulated or cut through along the cutting lines 52 so as to obtain a plurality of separated units 1'. Since the peripheral portion 32 of the first encapsulant 3' has a smallest thickness, the amount of the first encapsulant 3' to be cut by the cutting tool is reduced. As a result, the life of the cutting tool is improved. In addition, since the peripheral portion 32 has a small thickness, the degree of cracking and/or chipping of the first encapsulant 3' is reduced. Meanwhile, the carrier 2', the second encapsulant 16' and the first encapsulant 3' in one unit 1' become the carrier 2, the second encapsulant 16 and the first encapsulant 3. In the unit 1', a lateral surface 313 of the extending portion 31 is non-coplanar with a lateral surface 26 of the carrier 2. The peripheral portion 32 is closer to the lateral surface 26 of the carrier 2 than the extending portion 31 is. A lateral surface 323 of the peripheral portion 32 may be substantially coplanar with the lateral surface 26 of the carrier 2.

Figure 12:
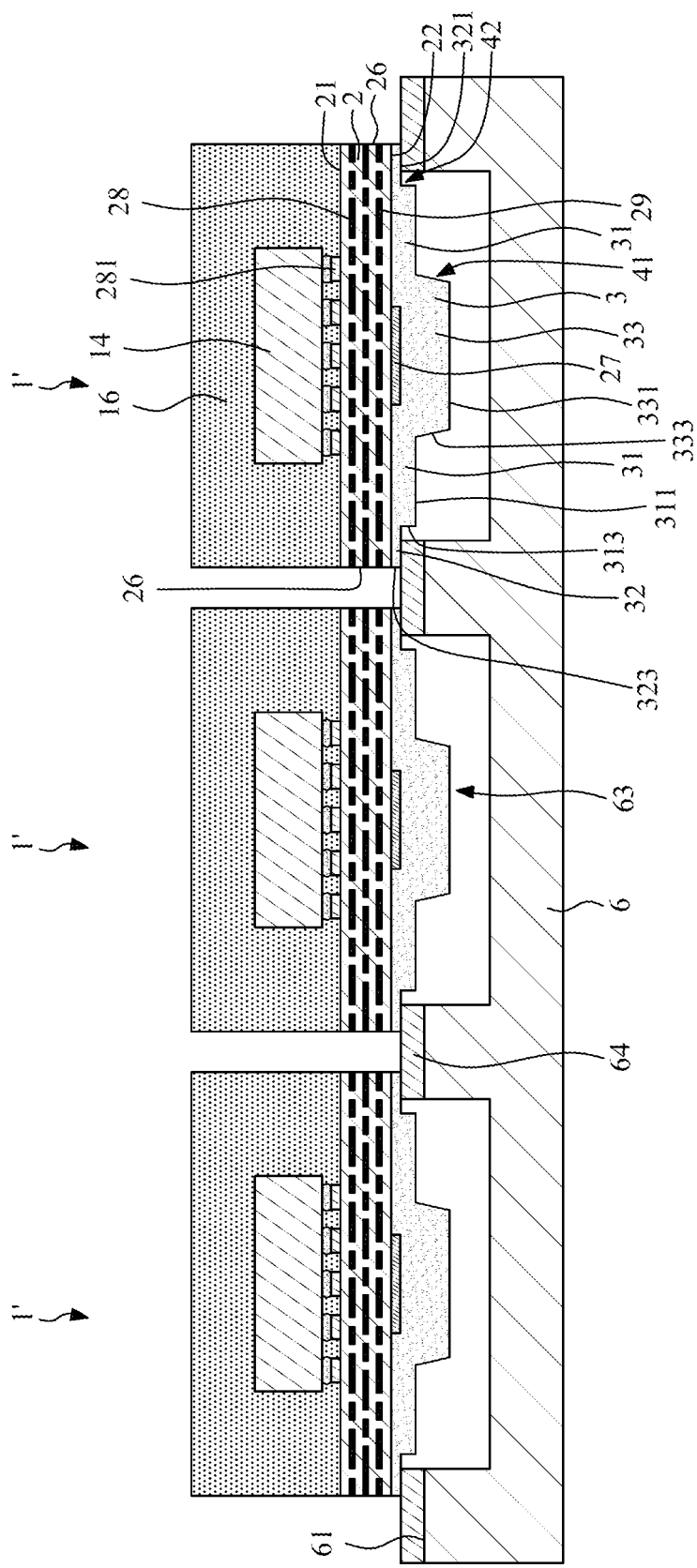
FIG. 12 illustrates one or more stages of an example of a method for manufacturing an antenna device according to some embodiments of the present disclosure.

Referring to FIG. 12, a carrier 6 and a buffer layer 64 are provided. The carrier 6 has a top surface 61 and a plurality of cavities 63 recessed from the top surface 61. Each of the cavities 63 may be configured to accommodate the first encapsulant 3 of the unit 1'. The buffer layer 64 (e.g., a tape) may be disposed on the top surface 61 of the carrier 6 except for the cavities 63. Then, the units 1' are disposed on or attached to the buffer layer 64 on the carrier 6. The main portion 33 of the first encapsulant is located in the cavity 63 of the carrier 6. A corner or an edge of the buffer layer 64 may sustain or support the second step 42 defined by the extending portion 31 and the peripheral portion 32 of the first encapsulant 3.

Figure 13:
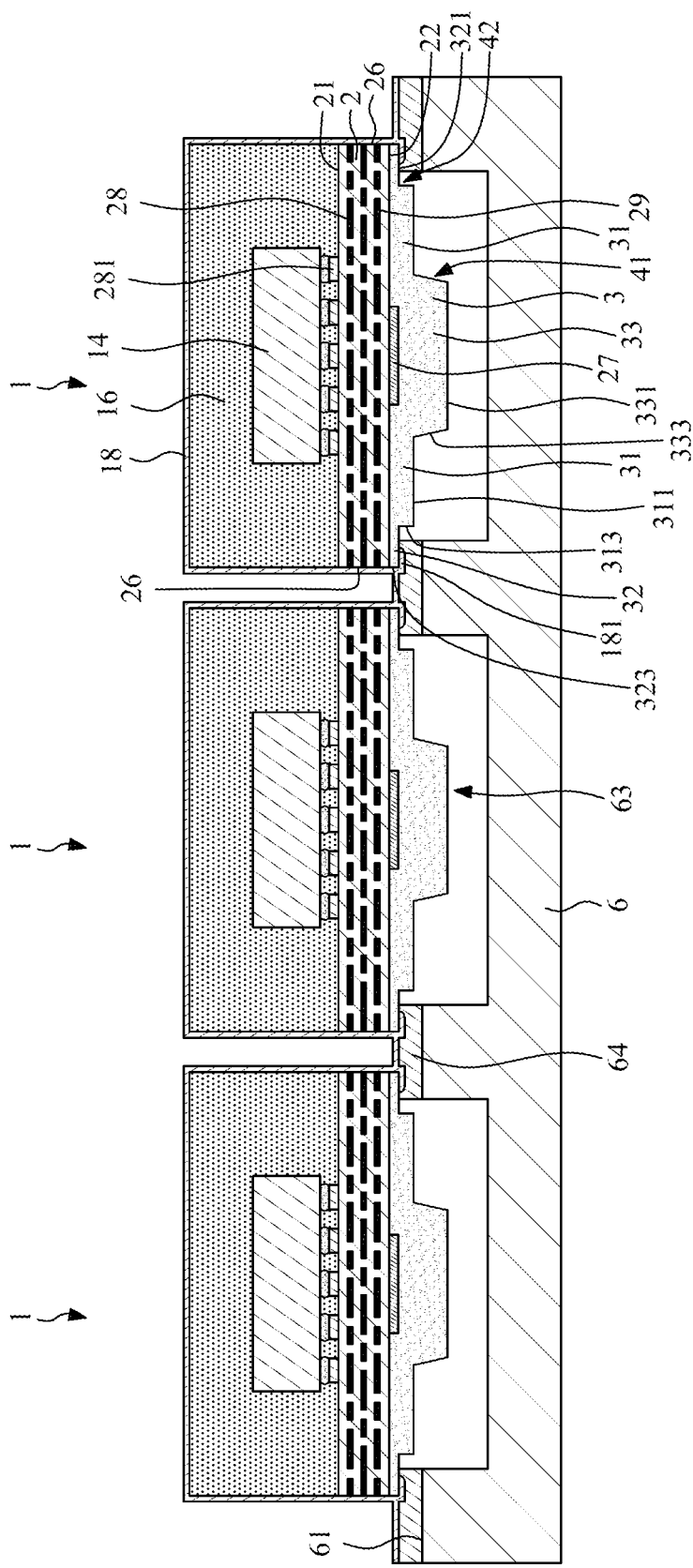
FIG. 13 illustrates one or more stages of an example of a method for manufacturing an antenna device according to some embodiments of the present disclosure.

Referring to FIG. 13, a shielding layer 18 (e.g., an electromagnetic interference (EMI) shielding material) may be formed to cover the units 1' by, for example, electroplating or sputtering. In some embodiments, the shielding layer 18 may cover the second encapsulant 16, the lateral surface 26 of the carrier 2, the lateral surface 323 of the peripheral portion 32 of the first encapsulant 3 and a portion of the top surface of buffer layer 64. In an ideal situation, the shielding layer 18 may not extend to the gap or space between the first surface 321 of the peripheral portion 32 of the first encapsulant 3 and the top surface of buffer layer 64. However, in some embodiments, an extending portion 181 of the shielding layer 18 may extend to the gap or space between the first surface 321 of the peripheral portion 32 of the first encapsulant 3 and the top surface of buffer layer 64 due to a less cracking and/or chipping on the edge of the peripheral portion 32 of the first encapsulant 3, which may be designated as bleeding or over-plating. In the illustrated embodiment, the extending portion 181 of the shielding layer 18 may be only disposed on the first surface 321 of the peripheral portion 32, and/or may be stopped by the lateral surface 313 of the extending portion 31. Thus, the risk that the extending portion 181 of the shielding layer 18 climbs over the second step 42 is reduced.

Then, the carrier 6, the buffer layer 64 and portions of the shielding layer 18 on the top surface of buffer layer 64 are removed so as to obtain a plurality of antenna devices 1 shown in FIG. 1. Then, a connector 12 may be disposed on a portion of the first surface 21 of the carrier 2 exposed from the second encapsulant 16 and the shielding layer 18 by, for example, surface mounting technology (SMT).

Figure 14:
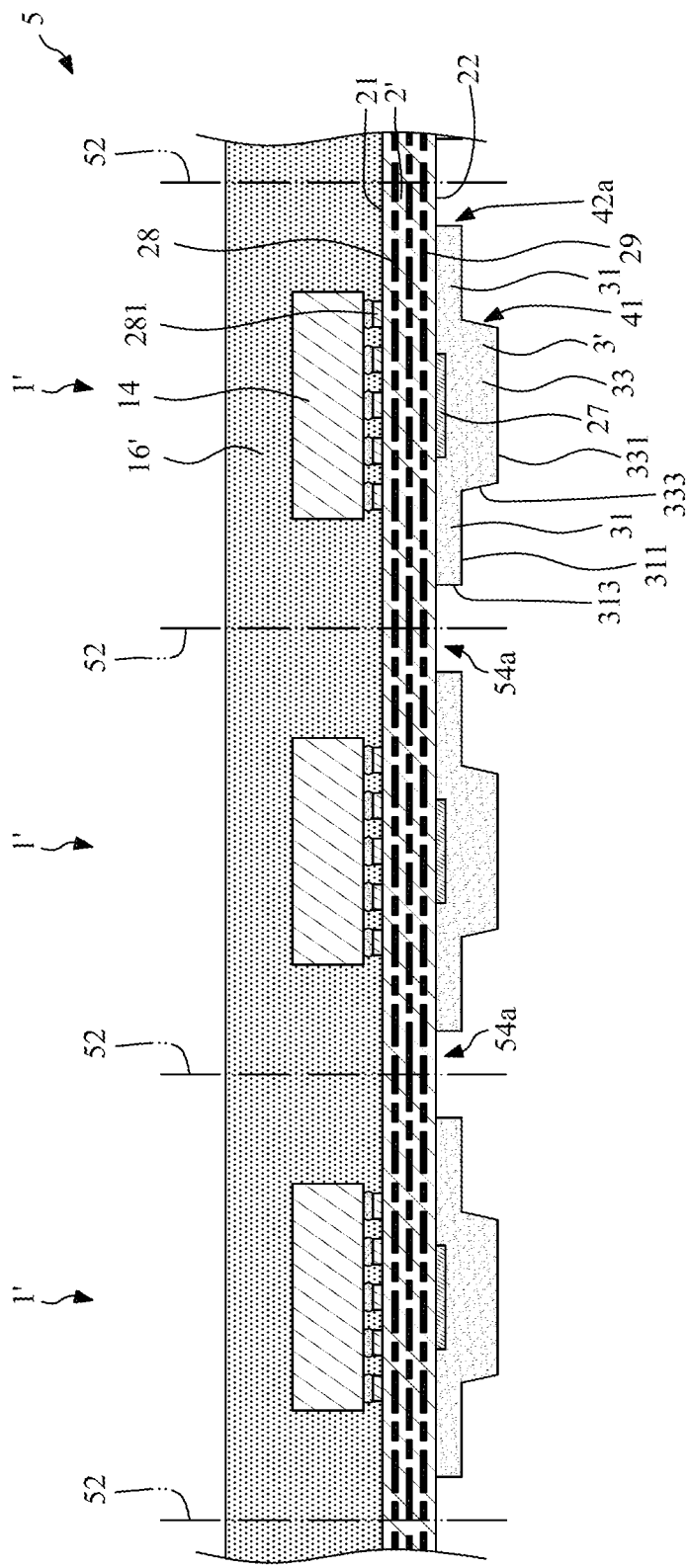
FIG. 14 illustrates one or more stages of an example of a method for manufacturing an antenna device according to some embodiments of the present disclosure.

FIG. 14 illustrates a method for manufacturing an antenna device according to some embodiments of the present disclosure, such as the antenna device 1a shown in FIG. 4. The initial stages of the illustrated process are the same as, or similar to, the stages illustrated in FIG. 8 to FIG. 9. FIG. 14 depicts a stage subsequent to that depicted in FIG. 9.

Referring to FIG. 14, portions of the base portion 35 on the cutting lines 52 are completely removed by, for example, a cutting tool such as a blade, so as to form a plurality of recesses 54a or grooves. The portions of the base portion 35 that are not removed (e.g., cut by the cutting tool) become a plurality of extending portions 31, and the first portions 24 of the second surface 22 of the carrier 2 are exposed. Thus, the recess 54a is defined by the extending portions 31 of the first encapsulants 3 and the first portion 24 of the second surface 22 of the carrier 2. The second step 42a may be defined by the first surface 311 of the extending portion 31, the lateral surface 313 of the extending portion 31 and the first portion 24 of the second surface 22 of the carrier 2.

Then, the following stages of the method may be similar to the stages illustrated in FIG. 11 to FIG. 13 so as to form the antenna device 1a of FIG. 4.

Figure 15:
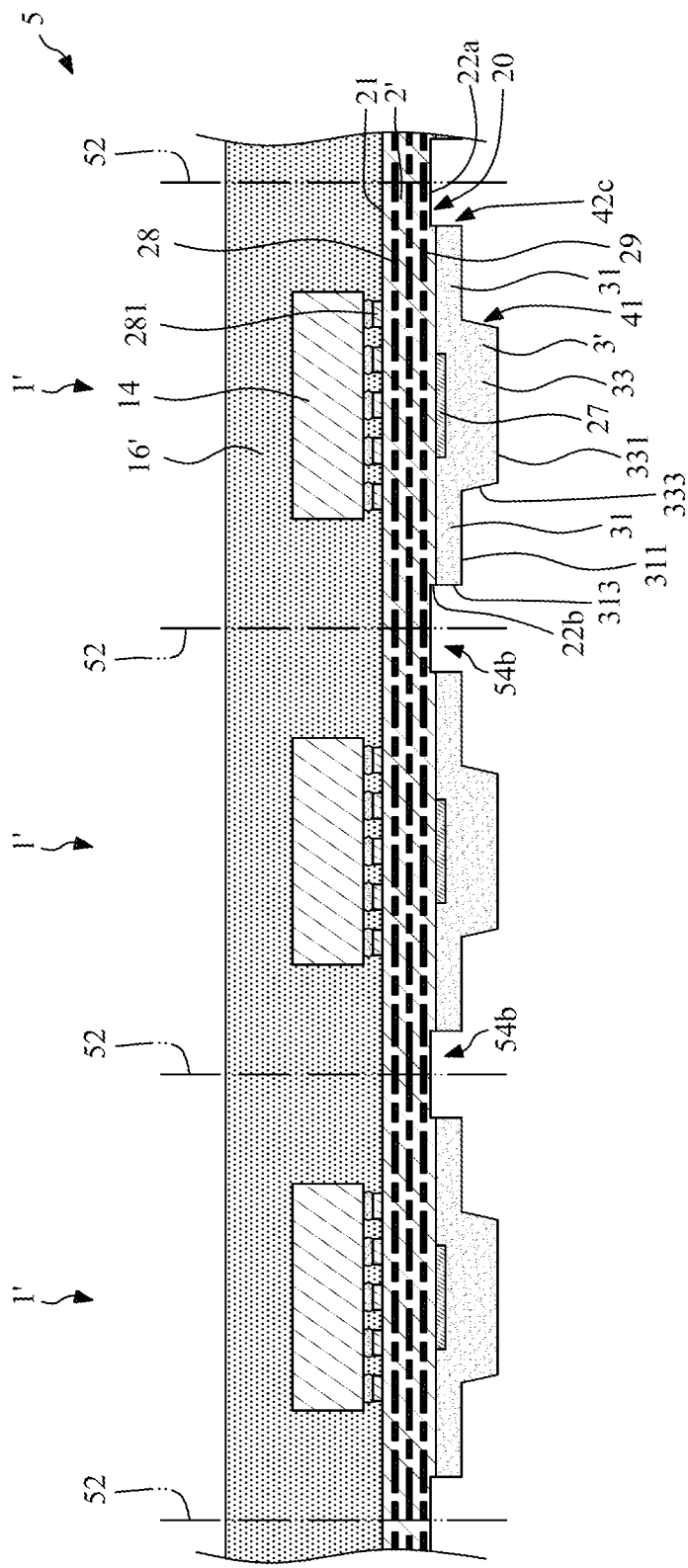
FIG. 15 illustrates one or more stages of an example of a method for manufacturing an antenna device according to some embodiments of the present disclosure.

FIG. 15 illustrates a method for manufacturing an antenna device according to some embodiments of the present disclosure, such as the antenna device 1c shown in FIG. 6. The initial stages of the illustrated process are the same as, or similar to, the stages illustrated in FIG. 8 to FIG. 9. FIG. 15 depicts a stage subsequent to that depicted in FIG. 9.

Referring to FIG. 15, portions of the base portion 35 and portions of the carrier 2 on the cutting lines 52 are removed by, for example, a cutting tool such as a blade, so as to form a plurality of recesses 54b or grooves. The portions of the base portion 35 that are not removed (e.g., cut by the cutting tool) become a plurality of extending portions 31, and a notch 20 is recessed from the second surface 22 of the carrier 2. Thus, the recess 54b is defined by the extending portions 31 of the first encapsulants 3 and the notch 20 of the carrier 2.

Then, the following stages of the method may be similar to the stages illustrated in FIG. 11 to FIG. 13 so as to form the antenna device 1c of FIG. 6.

Figure 16:
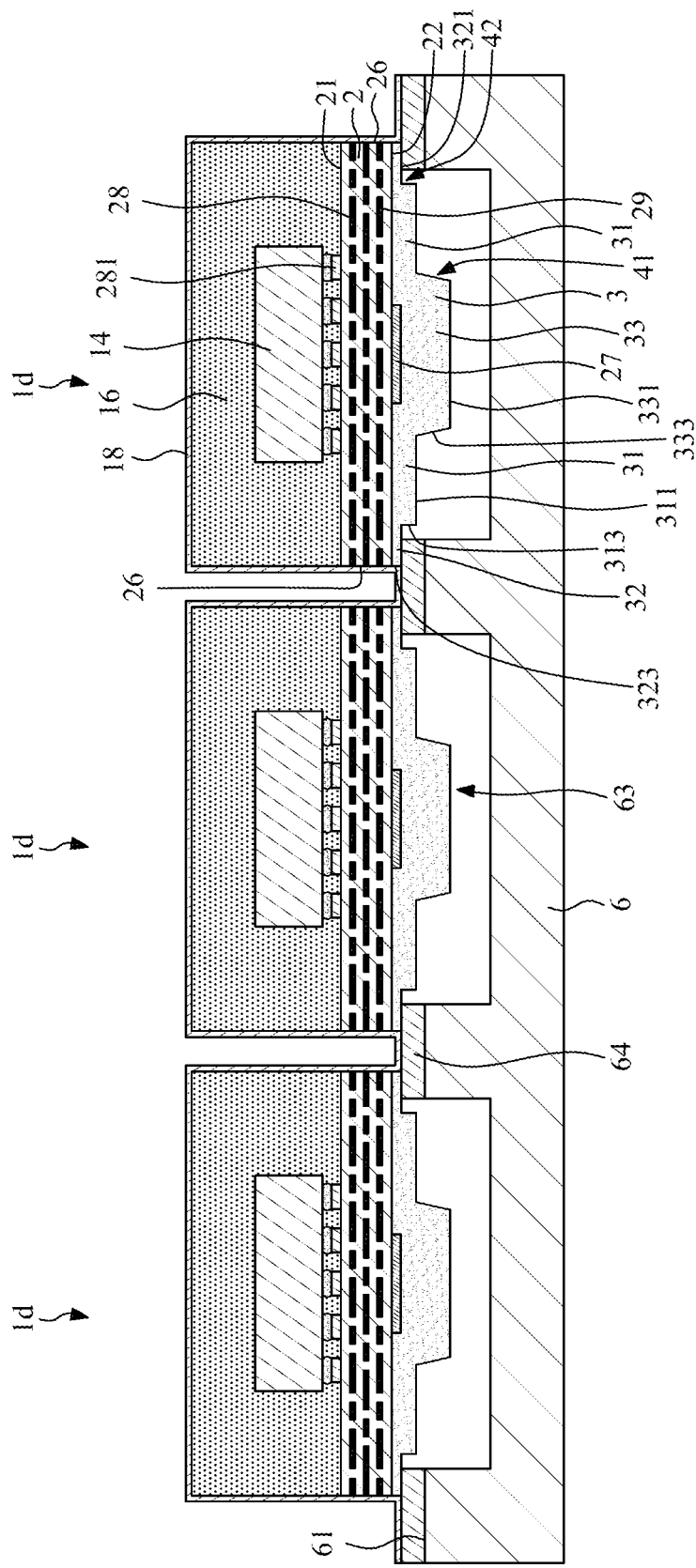
FIG. 16 illustrates one or more stages of an example of a method for manufacturing an antenna device according to some embodiments of the present disclosure.

FIG. 16 illustrates a method for manufacturing an antenna device according to some embodiments of the present disclosure, such as the antenna device 1d shown in FIG. 7 and FIG. 7A. The initial stages of the illustrated process are the same as, or similar to, the stages illustrated in FIG. 8 to FIG. 12. FIG. 16 depicts a stage subsequent to that depicted in FIG. 12.

Referring to FIG. 16, a shielding layer 18 (e.g., an electromagnetic interference (EMI) shielding material) may be formed to cover the units 1' by, for example, electroplating or sputtering. In some embodiments, the shielding layer 18 may cover the second encapsulant 16, the lateral surface 26 of the carrier 2, the lateral surface 323 of the peripheral portion 32 of the first encapsulant 3 and a portion of the top surface of buffer layer 64. The shielding layer 18 may not extend to the gap or space between the first surface 321 of the peripheral portion 32 of the first encapsulant 3 and the top surface of buffer layer 64.

Then, the carrier 6, the buffer layer 64 and portions of the shielding layer 18 on the top surface of buffer layer 64 are removed. Then, a connector 12 may be disposed on a portion of the first surface 21 of the carrier 2 exposed from the second encapsulant 16 and the shielding layer 18 by, for example, surface mounting technology (SMT) so as to obtain the antenna device 1d shown in FIG. 7 and FIG. 7A.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An antenna device comprising:
a carrier including an antenna region; and
a first encapsulant disposed under the carrier, the first encapsulant including a first portion uncovering the antenna region and configured for blocking a material from entering the antenna region, wherein the first portion has a lateral surface spaced apart from a lateral surface of the carrier, and the lateral surface of the first portion is closer to the lateral surface of the carrier than to the antenna region, wherein the first encapsulant further includes a second portion extending from the first portion to the lateral surface of the carrier, wherein a lower surface of the second portion is higher than a lower surface of the first portion with respect to the carrier, wherein a width of the first portion is greater than a width of the second portion.

2. The antenna device of claim 1, wherein the first encapsulant includes a third portion covering the antenna region, the first portion is disposed between the second portion and the third portion, wherein a lower surface of the third portion is lower than the lower surface of the first portion, wherein a width of the third portion is greater than the width of the first portion.

3. The antenna device of claim 1, wherein the antenna region includes a plurality of antenna patterns, the first encapsulant further includes a third portion vertically overlapping with the plurality of antenna patterns, wherein the third portion has a lateral surface tapering toward a direction away from the plurality of antenna patterns.

4. The antenna device of claim 1, wherein the first encapsulant further includes a third portion closer to the first portion than to the second portion, wherein a thickness of a decrease from the third portion to the first portion is greater than a thickness of a decrease from the first portion to the second portion.

5. The antenna device of claim 4, wherein the third portion has an inclined surface extending from the third portion to the first portion, and the first portion has a lateral surface substantially perpendicular to the second portion and extending from the first portion to the second portion.

6. The antenna device of claim 1, wherein the first encapsulant further includes a third portion covering the antenna region, wherein the first portion, the second portion and the third portion have different thicknesses, wherein the antenna device further includes a connector disposed over the carrier and vertically overlapping the first portion, the second portion and the third portion.

7. The antenna device of claim 6, wherein the connector does not vertically overlap with the material disposed under the second portion.

8. The antenna device of claim 6, further comprising a second encapsulant disposed over the carrier and exposing the connector, wherein the second encapsulant has an inclined surface facing to the connector.

9. An antenna device comprising:
a carrier including an antenna region; and
a first encapsulant disposed under the carrier, the first encapsulant including a first portion uncovering the antenna region and configured for blocking a material from entering the antenna region, wherein the first portion has a lateral surface spaced apart from a lateral surface of the carrier, and the lateral surface of the first portion is closer to the lateral surface of the carrier than to the antenna region, wherein the first encapsulant further includes a second portion extending from the first portion to the lateral surface of the carrier, wherein a lower surface of the second portion is higher than a lower surface of the first portion with respect to the carrier, wherein the material is connected to the lower surface of the second portion and exposes a part of the lower surface of the second portion.

10. The antenna device of claim 9, wherein the material has a curved end surface under the part of the lower surface of the second portion.

11. The antenna device of claim 10, wherein the curved end surface of the material tapers toward to the first portion.

12. The antenna device of claim 9, wherein a thickness of the first portion is greater than a thickness of the second portion.

13. An antenna device comprising:
a carrier including an antenna region; and
a first encapsulant disposed under the carrier, the first encapsulant including a first portion uncovering the antenna region and configured for blocking a material from entering the antenna region, wherein the first portion has a lateral surface spaced apart from a lateral surface of the carrier, and the lateral surface of the first portion is closer to the lateral surface of the carrier than to the antenna region, wherein the material includes an electromagnetic interference (EMI) shielding material, the first encapsulant further includes a second portion extending from the first portion to the lateral surface of the carrier, wherein a lower surface of the second portion is higher than a lower surface of the first portion with respect to the carrier, wherein the material vertically overlaps with the second portion and is spaced apart from the first portion along a horizontal direction.

14. The antenna device of claim 13, wherein the first portion exposes a portion of a bottom surface of the carrier.

15. The antenna device of claim 13, wherein the material has an edge disposed under the second portion, and the edge includes an irregular wavy profile in a bottom view.

* * * * *